US011751352B2

(12) United States Patent
Bousquet et al.

(10) Patent No.: US 11,751,352 B2
(45) Date of Patent: Sep. 5, 2023

(54) METHOD FOR LOCKING/UNLOCKING A REMOVABLE MODULE, AND ASSEMBLY FOR IMPLEMENTATION

(71) Applicant: LATELEC, Labege (FR)

(72) Inventors: Jean Francois Bousquet, Brugieres Occitanie (FR); Bastien Puertolas, Aigrefeuille Occitanie (FR)

(73) Assignee: LATELEC, Labege Occitanie (FR)

( * ) Notice: Subject to any disclaimer, the term of this patent is extended or adjusted under 35 U.S.C. 154(b) by 328 days.

(21) Appl. No.: 17/051,565

(22) PCT Filed: May 2, 2019

(86) PCT No.: PCT/EP2019/061175
§ 371 (c)(1),
(2) Date: Oct. 29, 2020

(87) PCT Pub. No.: WO2019/211346
PCT Pub. Date: Nov. 7, 2019

(65) Prior Publication Data
US 2021/0235593 A1    Jul. 29, 2021

(30) Foreign Application Priority Data

May 3, 2018   (FR) ........................................ 1853843

(51) Int. Cl.
*H05K 7/00*   (2006.01)
*H05K 7/14*   (2006.01)
(52) U.S. Cl.
CPC ................................. *H05K 7/1412* (2013.01)

(58) Field of Classification Search
CPC ...................................................... H05K 7/1412
(Continued)

(56) References Cited

U.S. PATENT DOCUMENTS 4,766,517 A * 8/1988 Abell .................... H05K 7/1412
361/825
5,010,426 A * 4/1991 Krenz .................. H05K 7/1411
360/99.06
(Continued)

FOREIGN PATENT DOCUMENTS

EP         1331712        7/2003
EP         1880588 B1 *   7/2010  ........... H05K 7/1412
(Continued)

*Primary Examiner* — Anatoly Vortman
*Assistant Examiner* — Zhengfu J Feng
(74) *Attorney, Agent, or Firm* — Defillo & Associates, Inc.; Evelyn A. Defillo

(57) ABSTRACT

A method and assembly for locking/unlocking, formed of one of several a removable module (2) and a mount plate (3). The assembly includes a support wall (4) supporting each removable module (2). The removable module (2) being provided with two lugs (5) through which an aperture passes. The lugs (5) extending out of the removable (2) so that they can be inserted into opening (7) formed in the support wall (4). This assembly is equipped with a locking/unlocking system (100) having a lever (10) extending under the support wall (4) and provided with circular eccentric cams (11) arranged with offset axial symmetry in the form of an S about a central rotation axle (20) perpendicular to the support wall (4). The lever (10) being fixed in terms of rotation on this central axle (2) at equal distances from the two openings (7).

12 Claims, 2 Drawing Sheets

Figure 1:
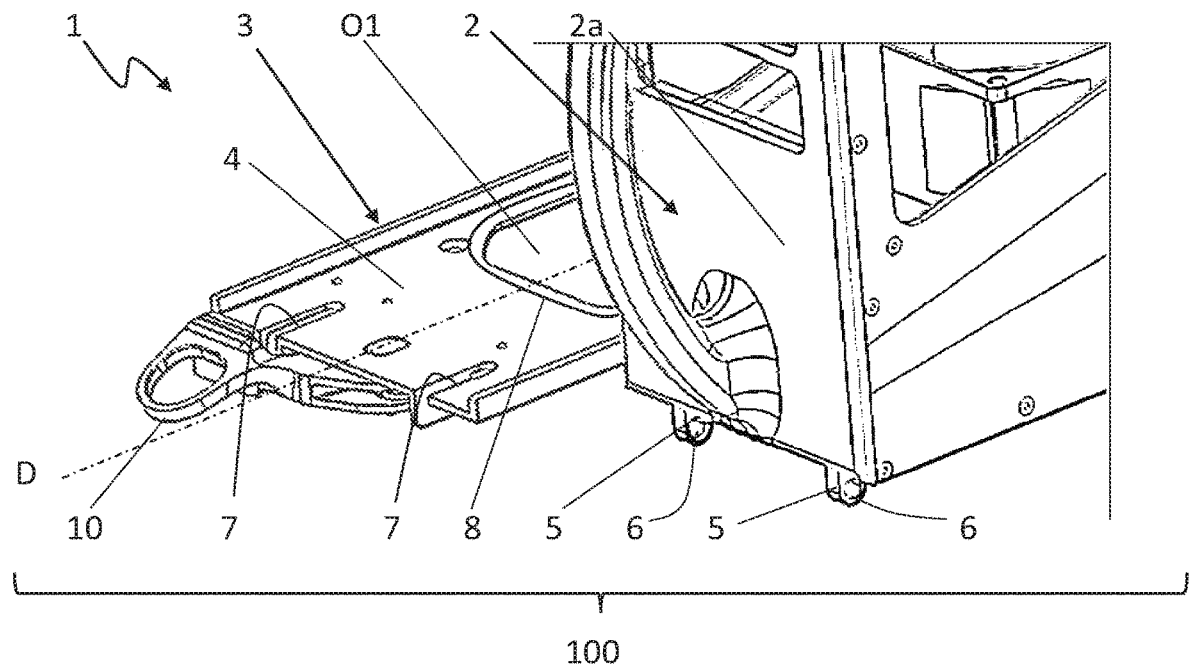

(58) Field of Classification Search
USPC .......................................................... 361/726
See application file for complete search history.

(56) References Cited

U.S. PATENT DOCUMENTS

| | | | | |
|---|---|---|---|---|
| 5,190,241 | A * | 3/1993 | Pease .................. | H05K 7/1412 |
| | | | | 174/541 |
| 6,272,016 | B1 * | 8/2001 | Matonis ............... | H05K 7/1404 |
| | | | | 361/732 |
| 6,373,713 | B1 * | 4/2002 | Jensen ................. | H05K 7/1409 |
| | | | | 439/153 |
| 6,549,424 | B1 * | 4/2003 | Beseth ................. | H05K 7/1409 |
| | | | | 361/801 |
| 6,700,787 | B1 * | 3/2004 | Beseth ................. | H05K 7/1412 |
| | | | | 361/728 |
| 6,797,879 | B2 * | 9/2004 | Leyda .................. | H05K 7/1412 |
| | | | | 174/17 VA |
| 9,999,147 | B1 * | 6/2018 | Quick .................. | H05K 7/1401 |
| 10,197,084 | B1 * | 2/2019 | Ankney ................. | F16B 21/09 |
| 2010/0277875 | A1 * | 11/2010 | Moorehead, Jr. ..... | H05K 7/1412 |
| | | | | 361/747 |
| 2018/0273198 | A1 * | 9/2018 | Chang .................. | H02J 1/001 |

FOREIGN PATENT DOCUMENTS

| | | |
|---|---|---|
| EP | 3008983 | 4/2016 |
| FR | 2938022 | 5/2010 |

\* cited by examiner

METHOD FOR LOCKING/UNLOCKING A REMOVABLE MODULE, AND ASSEMBLY FOR IMPLEMENTATION

CROSS REFERENCE TO RELATED APPLICATION

This application is a national stage entry of PCT/EP2019/061175 filed May 2, 2019, under the International Convention and claiming priority over French Patent Application No. 1853843 filed May 3, 2018.

TECHNICAL FIELD

The invention relates to a method for locking/unlocking a removable module, in particular an electronic module, in/from a mounting plate, and to a locking/unlocking assembly formed from one or more removable modules, from a mounting plate and from a locking/unlocking system for implementing such a method.

The invention relates more particularly to the aeronautical field in which numerous modules (also known as LRUs, an acronym for "line replaceable unit") are reversibly set into avionics mounting plate called a bay, rack or cabinet. The removable modules are arranged in these housings so that they can withstand severe mechanical stresses during the journey, in particular vibrations, jolts or large variations in speed.

Avionics mounting plate has an individual housing for each module and has, if necessary, ventilation and electrical connections. The mounting plate can then offer the modules a passage for the flows of ventilation air in connection with their immediate surroundings. The invention can also apply to mounting plates used in other transport fields in which similar stresses exist (the motor vehicle field, the railroad field, etc.).

Avionics mounting plates for removable modules or LRUs comply with the ARINC standard or other standards. A plate equipped with a module locking means in accordance with this standard is for example described in the patent document U.S. Pat. No. 6,797,879. In this locking means, a nut provided with a knob is fastened to the bottom of the module by means of an articulated screw. In order to hold this module, the screw is inserted into a slot arranged in the lower lip of a mounting plate. The nut is then tightened. This nut is equipped with a pawl device preventing unwanted loosening thereof as a result of vibrations. However, this locking means has several drawbacks: the fastening force is adjusted at random, a tightening force that is too low will not lock the module sufficiently and a tightening force that is too high risks damaging the locking means; no visual means for checking the locking state is provided; a duration of the tightening operation that is too long, and the use of two independent locks requires dual management.

PRIOR ART

Several solutions have contributed to improving this locking system. The patent document FR 2 938 022 presents, for example, a device that can be inserted into a receiving support and has two lateral locking handles holding the device by elastic return means that are mounted in the support.

Each handle is mounted in rotation on the device and has an open eccentric cam. A protuberance of the support is introduced into and circulates in each open cam when a tensile force is exerted on the handles in rotation against the return force. Locking is realized when the protuberance is in abutment in the cam in equilibrium with the return force.

However, these means do not strictly speaking lock the device in the support but constitute means for positioning the device since the equilibrium realized with the return means is not consolidated. Furthermore, the means used (stiffness constant that varies over time, open cams, handles mounted in rotation) have a limited service life, are relatively complex and fragile and comprise two systems that need to be exactly coordinated.

In another document EP3 008 983, a pivoting handle fastens an interconnection module to the side of an electronic receiving rack, by the exertion of a dual movement on this handle: first alateral movement for transverse positioning on one side of the rack, then a translational movement perpendicular to the lateral movement for the insertion of the module toward the side of the rack. Such a system has complex rotation/translation kinematics, with a large number of elements (rear wall and lateral face connectors, coupling of connectors with the bottom wall, closure means, releasable locking means, module handle, etc.), and this also generates an increase in mass.

SUMMARY OF THE INVENTION

The main object of the invention is to allow reversible fastening of the module in a plate while affording ease and simplicity of use, and reduction of mass while guaranteeing high resistance to vibrations, jolts, turbulence or acceleration/deceleration. To this end, the invention provides for a single closure action by rotation causing locking by translation and reversible blocking of each module, without tools or the need for adjustment.

To this end, one subject of the invention is a method for locking/unlocking a removable module in/from a fixed mounting plate having a wall for supporting said removable module. The removable module has two tenons each provided with a hole, these tenons extending out from the removable module so that they can be inserted into openings formed in the mounting plate. This method consists, in the locking phase, in:

placing the removable module on the wall of the mounting plate, inserting the two tenons into the openings in the support wall of the mounting plate;

activating a lever with eccentric cams toward a locked position, this lever being mounted in rotation between the openings beneath the support wall between an unlocked position and the locked position;

driving, by this rotation, two pins in opposite translational movements, each pin cooperating with an eccentric cam while being secured to an extension that extends transversely to the support wall such that the extensions pass through the holes in the tenons of the removable module perpendicularly, and reversibly blocking the lever in the locked position.

And, in the unlocking phase, in:

unblocking the lever from its locked position;

activating the reverse rotation of the lever until it is in the unlocked position so as to cause the extensions to be withdrawn from the holes via the reverse translation of the pins, and removing the module from the mounting plate.

Advantageously, the locked position is signaled by a signal, in particular a sound or light signal. Furthermore, a visual check makes it possible to verify this locked position.

Another subject of the invention is a locking/unlocking assembly formed from one or more removable modules and from a mounting plate, the assembly being equipped with a locking/unlocking system for implementing such a method. In this assembly, the mounting plate has a wall for supporting each removable module, and each removable module is provided with two tenons with a hole passing through them, the tenons extending out from the removable module so that they can be inserted into openings formed in the support wall.

Furthermore, the locking/unlocking system is provided with a lever extending beneath the support wall and provided with two camways of circular-arc eccentric cams arranged with an offset axial symmetry, forming an "S" shape about a central rotary shaft perpendicular to the support wall, the lever being rotationally fixed to this central shaft at the same distance from the two openings. Each cam cooperates with a pin secured to an extension that is able to move in translation via guide means along the support wall through the holes in the tenons of each removable module. Thus, the lever, in rotating, can drive the two secured pins and the extensions in opposite translational movements between two extreme locked/unlocked positions, the locked position preferably being blocked by reversible fastening means in connection with the support wall.

Advantageously, the extreme locked position is defined by a blocked position given by the reversible fastening means. And the extreme unlocked position is defined by a position of the pins in abutment in the camways.

The advantages of such an assembly are to make it possible to lock each module in a single action, and to exert a predefined tightening force in order to realize this locking. Furthermore, such an assembly affords accurate and very precise positioning, superior to that obtained by a fastening according to the ARINC standard. Such an assembly is therefore well suited to being used in an aircraft or in an environment that has high mechanical stresses (jolts, vibrations, etc.).

According to advantageous features:

the support wall extending primarily in a longitudinal direction, the openings in the support wall are preferably in the form of slots parallel to the longitudinal direction of said wall;

the reversible fastening means are chosen from hook-and-loop fastener strips, a locking button, a clip and a quarter-turn latch;

the removable module having a front wall and a rear wall that are upright at the edge of a contact surface that comes after locking against the support wall of the mounting plate, the tenons are arranged in the extension of the front wall and the rear wall has at least one housing for engagement of a cleat for assembling the removable module with the mounting plate, this cleat being arranged on an upright wall at the edge of the mounting plate;

the rear wall also has at least one connector for coupling with another connector arranged on the upright wall at the edge of the mounting plate, these connectors being able to be electrical, hydraulic, optical or equivalent;

the contact surface of the removable module and the support wall of the mounting plate each having a ventilation opening, which openings are arranged facing one another, and at least one of these openings being bordered by a seal for these openings, the locking of the removable module by the locking/unlocking system and the assembly by the one or more cleats compress the seal; under these conditions, the precision of the locking allows the final position of the module to be exactly defined;

the material of the lever and of the extensions is chosen from a composite, a plastics material and a metal alloy;

the extensions are tapered;

the locked position is communicated by a signal.

Another subject of the invention is an aircraft having at least one locking/unlocking assembly formed from one or more removable modules and from one or more mounting plates, as are defined above.

In the present text, the qualifiers "on", "below" and "beneath" relate to locations of elements relative to items of equipment positioned in standard use. In the figures, identical or similar elements are referenced by a single reference sign that refers to the passage(s) of the description that mention it.

PRESENTATION OF THE FIGURES

Figures 2A, 2B:
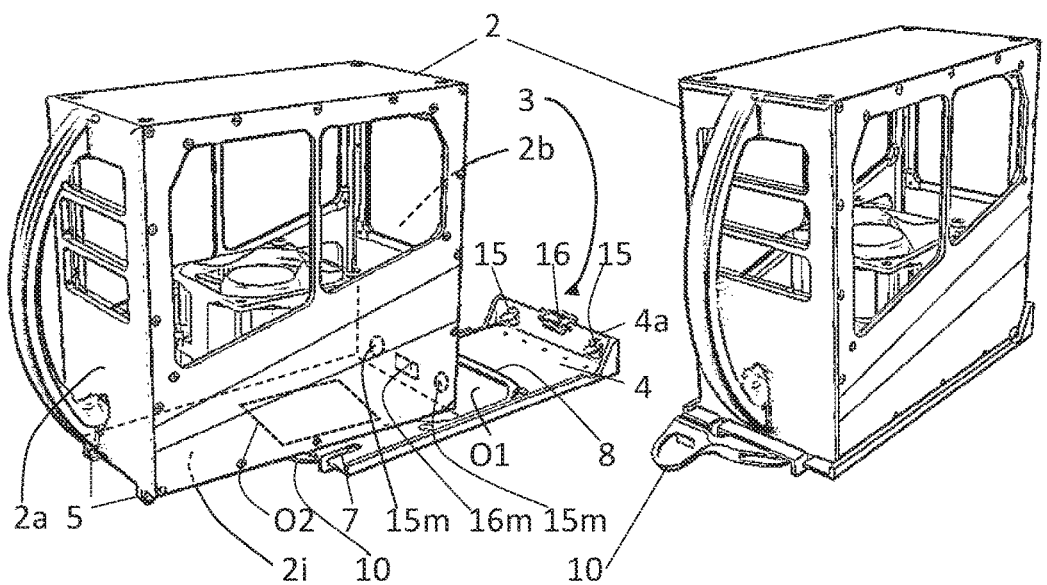
Figure 3:
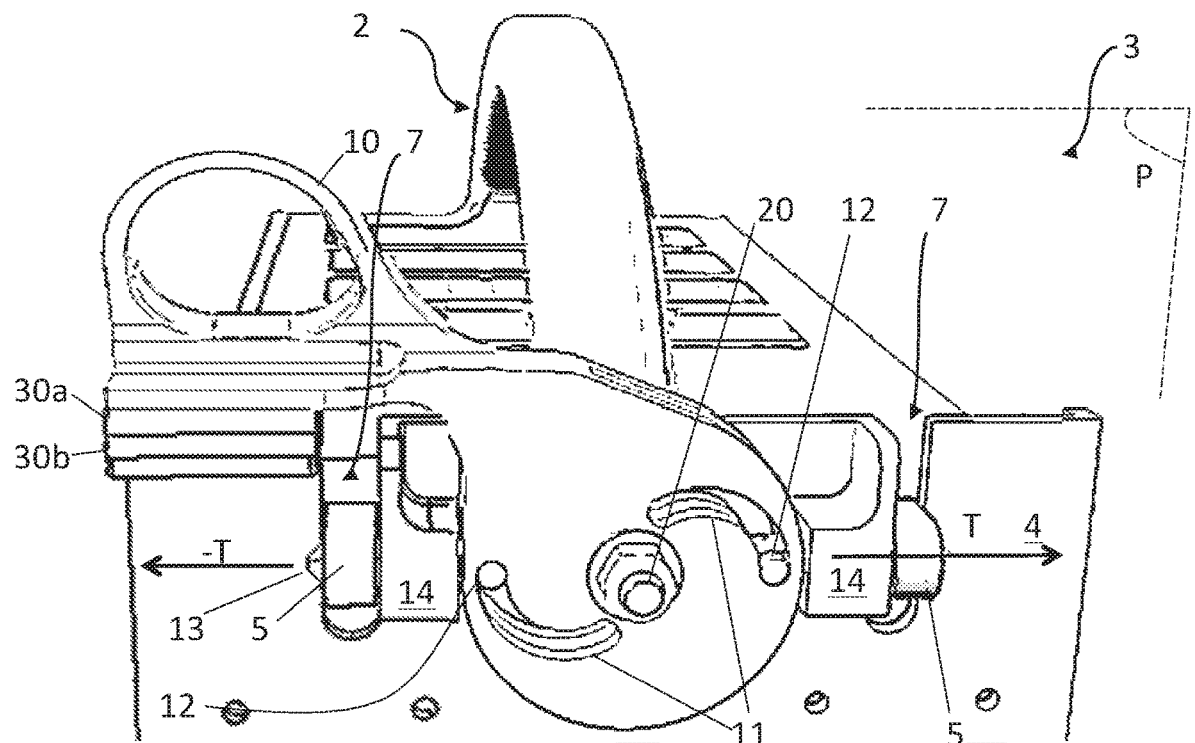
Figures 4A, 4B, 4C:
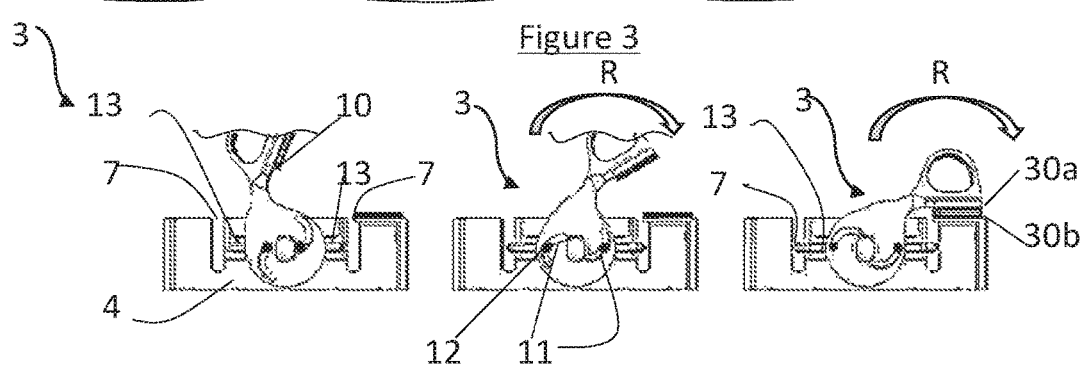
Figures 5A, 5B, 5C:
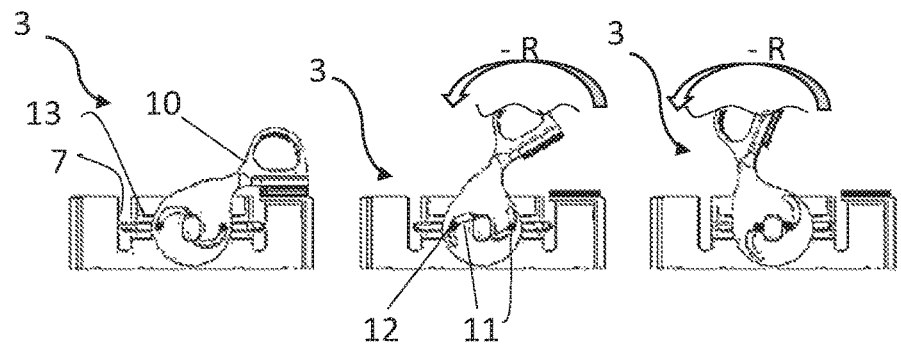

Other information, features and advantages of the present invention will become apparent upon reading the following non-limited description, with reference to the appended figures which show, respectively:

FIG. 1 shows a partial perspective view of an example of an assembly formed from a removable module, from a mounting plate and from a system for locking/unlocking the module on/from the plate according to the invention;

FIG. 2*a* shows a first step of the method according to the invention for locking/unlocking the module on/from the plate in the example according to FIG. 1;

FIG. 2*b* shows a second step of the method according to the invention for locking/unlocking the module on/from the plate in the example according to FIG. 1;

FIG. 3, a view from below of the locking/unlocking system and of the mounting plate according to the preceding figures;

FIG. 4*a* shows a first locking phase of the method according to the invention;

FIG. 4*b* shows a second locking phase of the method according to the invention;

FIG. 4*c* shows a third locking phase of the method according to the invention;

FIG. 5*a* shows a first unlocking phase of the method according to the invention;

FIG. 5*b* shows a second unlocking phase of the method according to the invention; and FIG. 5*c* shows a third unlocking phase of the method according to the invention.

DETAILED DESCRIPTION

FIG. 1 presents a perspective view of an example of an assembly 1 according to the invention formed from a removable module 2 of electronic module type or some other utility module for the crew, from a mounting plate 3 and from a locking/unlocking system 100. The removable module 2 of substantially parallelepipedal shape has in particular a contact surface 2*i* and upright front 2*a* and rear 2*b* walls at the edge of the contact surface 2*i*. The removable module 2 is provided with two tenons 5 with a bore 6 forming a hole passing through them, the tenons 5 extending the front wall 2*a* of the module 2 beyond this removable module. The mounting plate 3 has a wall 4 for supporting the removable module 2.

These tenons 5 are inserted into parallel slots 7 formed in the support wall 4. Furthermore, the locking/unlocking system 100 has a lever 10 extending beneath the support wall 4, transversely to this generally rectangular wall 4, i.e.

perpendicular to its main direction "D". The operation of the lever 10 is described in detail with reference to FIG. 3.

FIGS. 2a and 2b present two first steps of the locking/unlocking method according to the invention. In FIG. 2a, the removable module 2 is in the process of being placed on the mounting plate 3, the lever 10 (which is concealed by the removable module 2 in this figure) is in the unlocked position. The tenons 5 arranged beneath the module 2 are intended to be inserted in the slots 7 formed in the support wall 4, FIG. 2b illustrating the positioning of the module 2 after insertion of the tenons 5 in the slots 7. In this FIG. 2b, the removable module 2 is placed on the mounting plate 3, the lever 10 now being in the locked position.

The removable module 2 has a front wall 2a and a rear wall 2b, these two walls being upright at the edge of a contact surface 2i, this contact surface 2i facing the support wall 4 of the mounting plate 3, after locking of the module 2 on the plate 3. The rear wall 2b of the module 2 has two housings 15m that can each receive an assembly cleat 15 arranged on the rear wall 4a of the mounting plate 3. Furthermore, the rear wall 2a of the module 2 also has an electrical connector 16m that is able to be connected to another electrical connector 16 arranged on the rear wall 4a of the mounting plate 3.

The contact surface 2i of the module 2 has a ventilation opening O2, which is placed facing an opening O1 arranged on the support wall 4 of the mounting plate 2, after locking of the module 2. The opening O1 is bordered by a seal 8. The locking of the module 2 by the locking/unlocking system and the assembly by the cleats 15 makes it possible to compress the seal 8 with enough force to ensure good sealing.

FIG. 3 more precisely shows the operation of the lever 10, seen from below the mounting plate 3, when this plate supports the module 2. This lever 10 extends beneath the support wall 4, and is provided with two camways of circular eccentric cams 11 arranged with offset axial symmetry, forming an "S" about a central rotary shaft 20 perpendicular to the support wall 4. The lever 10 is rotationally fixed to this central shaft 20 at the same distance from the two slots 7.

Each cam 11 cooperates with a pin 12 secured to a cylindrical transverse extension 13 (perpendicular to the longitudinal direction of the wall 4). These extensions 13 are able to move in opposite translational movements (arrows "T" and "–T") in bores (not visible in the figure) formed in bosses 14 secured to the support wall 4. Alternatively, the transverse extensions 13 can be guided by a groove or hasps.

The lever 10 rotated by the operator then drives the pins 12 between two extreme locked/unlocked positions. The lever 10 then simultaneously drives the extensions 13 in opposite translational movements "T" and "–T" through the bores 6 (cf. FIG. 1) in the tenons 5. Advantageously, the extensions 13 have tapered ends so as to advance easily in the bores in the bosses 14.

Thus, putting the lever 10 in the locked position allows the removable module 2 to be held by a single closure action by rotation causing locking by translation and reversible blocking, without tools or the need for adjustment.

In this exemplary embodiment, the locked position is blocked by hook-and-loop fastener strips 30a and 30b, the strip 30a being secured to the lever 10 and the strip 30b being secured to the support wall 4. Alternatively, the reversible blocking can be realized by a locking button, a clip and a quarter-turn latch. Furthermore, in the example the lever 10 and the extensions 13 are made from metal alloys.

In other exemplary embodiments, these parts are made from plastics material or from composite material.

The views in FIGS. 4a to 4c and 5a to 5c that illustrate the locking and unlocking phases are realized in a plane "P" in FIG. 3, parallel to the support wall 4.

FIGS. 4a to 4c present three main locking phases of the method according to the invention. In FIG. 4a, the lever 10 is in the unlocked position, the two extensions 13 are retracted from the side of the lever 10 and the two slots 7 are therefore free to access. Once the module 2 has been set in place and the tenons 5 thereof (cf. FIG. 3) have been inserted into the slots 7, the lever 10 with eccentric cams is activated in rotation "R" toward a locked position, as illustrated by FIG. 4b.

This activation drives the pins 12 in opposite translational movements, each pin 12 cooperating with an eccentric cam 11 while being secured to an extension 13 that extends parallel to the plane P. The extensions 13 then pass through the holes 6 in the tenons 5 (cf. FIG. 1). In FIG. 4c, the lever 10 is blocked in the locked position reversibly, by means of the hook-and-loop fastener strips 30a and 30b.

The locked position is advantageously signaled by a sound and/or visual alert, following contact of the extensions 13 with the walls of the slots 7, or by contact of the lever 10 in the locked position with a contact placed in the vicinity of the hook-and-loop fastener strip 30b.

FIGS. 5a to 5c present three main phases of the unlocking method according to the invention. In FIG. 5a, the lever 10 is placed in its locked position. Then, in FIG. 5b, the reverse rotation "–R" of the lever 10 is activated until the latter is in the unlocked position, this causing the extensions 13 to be withdrawn via the reverse translation of the pins 12. Finally, in FIG. 5c, after withdrawal of the extensions 13, the module 2 (cf. FIGS. 1, 2 and 3) can be removed from the mounting plate.

The invention is not limited to the embodiments described and shown. Thus, the slots may be parallel to one another, or not parallel, it is sufficient for the position of the slots in the mounting plate to be compatible with the position of the tenons. Furthermore, the slots can be replaced with circular orifices. Moreover, the removable module and the mounting plate can have openings intended to lighten the weight of these parts. Furthermore, the connectors at the rear can be of electrical, hydraulic or optical type, or equivalent.

The invention claimed is:

1. A method for locking/unlocking a removable module (2) in/from a fixed mounting plate (3) having a support wall (4) for supporting said removable module (2) that has two tenons (5) each provided with a hole (6), the tenons (5) extending out from the removable module (2) to be inserted into openings (7) formed in the fixed mounting plate (3), the method comprising a locking phase, with the steps of:

placing the removable module (2) on the wall (4) of the fixed mounting plate (3), inserting the two tenons (5) into the openings (7) in the support wall (4) of the fixed mounting plate (3);

activating a lever (10) with eccentric cams (11) toward a locked position, the lever (10) rotates between the openings beneath the support wall (4) between an unlocked position and the locked position;

driving, by the rotation, two pins (12) in opposite translational movements, each pin (12) cooperating with the eccentric cams (11) while being secured to an extension (13) that extends transversely to the support wall (4) such that the extension (13) passes through the holes (6) in the tenons (5) of the removable module (2) perpendicularly, and reversibly blocking the lever (10) in the locked position; and, in an unlocking phase, in:
  unblocking the lever (10) from the locked position;
  activating a reverse rotation of the lever (10) until it is in the unlocked position so as to cause the extensions (13) to be withdrawn from the holes (6) via a reverse translation of the pins (12), and
  removing the removable module (2) from the fixed mounting plate (3).

2. The locking/unlocking method as claimed in claim 1, wherein the locked position is communicated by a signal.

3. A locking/unlocking assembly formed from at least one removable modules (2) and from a fixed mounting plate (3), the assembly comprising: a wall (4) for supporting each one of the removable modules (2), each one of the removable modules (2) being provided with two tenons (5) with a hole (6) passing through them, the tenons (5) extending out from the removable module (2) inserted into openings (7) formed in the support wall (4), and is provided with a locking/unlocking system (100) has a lever (10) extending beneath the support wall (4) and provided with two camways of eccentric cams (11) arranged with an offset axial symmetry, forming an "S" shape about a central rotary shaft (20) perpendicular to the support wall (4), the lever (10) being rotationally fixed to the central rotary shaft (20) at a same distance from the openings (7), and each eccentric cam (11) cooperating with two pins (12) secured to an extension (13) able to move in translation via a guide device along the support wall (4) through the holes (6) in the tenons (5) of each one of the removable modules (2).

4. The locking/unlocking assembly as claimed in claim 3, wherein the lever (10), in rotating, is able to drive the two pins (12) and the extensions (13) in opposite translation movements between a locked position and an unlocked position, the locked position being blocked by a reversible fastening device (30a, 30b) in connection with the support wall (4).

5. The locking/unlocking assembly as claimed in claim 3, wherein, the support wall (4) extending primarily in a longitudinal direction, the openings (7) in the support wall (4) are slots (7) parallel to the longitudinal direction of said wall (4).

6. The locking/unlocking assembly as claimed in claim 4, wherein the reversible fastening device is chosen from hook-and-loop fastener strips (30a, 30b), a locking button, a clip, and a quarter-turn latch.

7. The locking/unlocking assembly as claimed in claim 3, wherein, the removable module (2) having a front wall (2a) and a rear wall (2b) that are upright at an edge of a contact surface (2i) that comes after locking against the support wall (4) of the fixed mounting plate (3), the tenons (5) are arranged in an extension of the front wall (2a) and the rear wall (2b) has at least one housing (15m) for engagement of a cleat (15) for assembling the removable module (2) with the fixed mounting plate (3), the cleat (15) being arranged on an upright wall (4a) at an edge of the fixed mounting plate (3).

8. The locking/unlocking assembly as claimed in claim 7, wherein the rear wall (2b) has at least one connector (16m) for coupling with a second connector (16) arranged on the upright wall (4a) at the edge of the fixed mounting plate (3).

9. The locking/unlocking assembly as claimed in claim 7, wherein, the contact surface (2i) of the removable module (2) and the support wall (4) of the fixed mounting plate (3) each having a ventilation opening (O1, O2), the ventilation openings are arranged facing one another, and at least one of the openings being bordered by a seal (8), when the removable module (2) is locked by the locking/unlocking system and the locking/unlocking assembly by the cleats (15) and the seal (8) compressed when the removable module is locked.

10. The locking/unlocking assembly as claimed in claim 4,
  wherein the material of the lever (10) and of the extension (13) is chosen from a composite, a plastics material, and a metal alloy.

11. The locking/unlocking assembly as claimed in claim 4, wherein the extensions (13) is tapered.

12. An aircraft comprising: the locking/unlocking assembly formed from a removable modules (2) and from fixed mounting plate (3) as claimed in claim 3.

* * * * *